United States Patent
Shibuya

(10) Patent No.: US 6,269,034 B1
(45) Date of Patent: Jul. 31, 2001

(54) SEMICONDUCTOR MEMORY HAVING A REDUNDANCY JUDGMENT CIRCUIT

(75) Inventor: Masahiro Shibuya, Kanagawa (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/593,210

(22) Filed: Jun. 14, 2000

(30) Foreign Application Priority Data

Jun. 14, 1999 (JP) .................................................. 11-166811

(51) Int. Cl.[7] ...................................................... G11C 7/00
(52) U.S. Cl. ............................ 365/200; 365/194; 365/233
(58) Field of Search .................................. 365/200, 194, 365/233, 189.01, 230.01

(56) References Cited

U.S. PATENT DOCUMENTS

| | | | |
|---|---|---|---|
| 4,723,227 | * 2/1988 | Murotani | 365/200 |
| 5,640,365 | * 6/1997 | Imamiya et al. | 365/236 |
| 5,777,931 | * 7/1998 | Kwon et al. | 365/200 |
| 5,959,906 | * 9/1999 | Song et al. | 365/200 |

* cited by examiner

*Primary Examiner*—Hoai V. Ho
(74) *Attorney, Agent, or Firm*—McGinn & Gibb, PLLC

(57) ABSTRACT

In a semiconductor memory having a redundancy circuit, when a defective cell is replaced with a redundancy cell, activation of a normal word line is retarded until it is judged whichever of a redundancy word line and a normal word line should be activated. The semiconductor memory has address pre-decoders enabling selection and driving of a normal word line, and a redundancy control circuit for judging whether a redundancy word line should be activated. The address pre-decoders and redundancy control circuit are controlled mutually independently. Irrespective of whether a redundancy word line is used, a normal word line can be controlled earlier. Consequently, the action of the whole semiconductor memory can be speeded up.

21 Claims, 9 Drawing Sheets

SEMICONDUCTOR MEMORY HAVING A REDUNDANCY JUDGMENT CIRCUIT

BACKGROUND OF THE INVENTION

1. Field of the Invention

The present invention relates to a semiconductor memory, or more particularly, to a semiconductor memory having a redundancy circuit.

2. Description of the Related Art

A redundancy circuit is used to replace a defective cell included in a memory, or especially, a dynamic RAM with a redundancy cell.

For preventing establishment of a multiword state, in which both a normal word line and a redundancy word line are activated, during such replacement of a defective cell, activation of a normal word line is retarded until it is judged whichever of a redundancy word line and the normal word line should be activated. In recent years, it has been requested to shorten a time interval from the instant an address is supplied to the instant data stored in memory cell is read out based on the address.

FIG. 8 is a circuit diagram showing an example of a related art circuit. FIG. 9 is a timing chart showing the waveforms of signals produced in the circuitry.

First, external address signals A0 to Aj are stored in row address buffers 110. The row address buffers 110 acquire the external address signals A0 to Aj at the leading edge of an external address latching signal ECLK. Row address signals XA0 to XAj output from the row address buffers 110 are input to an address judgment circuit 130 and address pre-decoders 120. The address judgment circuit 130 compares the row address signals XA0 to XAj with a pre-set address in response to a redundancy latching signal. If the row address signals XA0 to XAj agree with the pre-set address, a redundancy judgment signal AC remains active (solid line in AC in FIG. 9). If the row address signals XA0 to XAj disagree with the pre-set address, the redundancy judgment signal AC is inactive (dashed line in AC in FIG. 9). A redundancy control circuit 140 reads the redundancy judgment signal AC at the leading edge of a row address latching signal RCLK' after address judgment is completed, and then judges whether a redundancy word line should be activated. At this time, an address pre-decoder 120 acquires signals resulting from pre-decoding of the row address signals XA0 to XAj and outputs address pre-decoded signals PXA0 to PXAk to a normal word decoder 160. Either of a normal word line and a redundancy word line is activated based on a redundancy word enabling signal RDC and a normal word enabling signal XDES that are output signals of the redundancy control circuit 140.

According to the related art shown in FIG. 8 and FIG. 9, for preventing establishment of a multiword state, both the normal word decoder 160 and redundancy word decoder 150 are held unselected until a time instant when it is judged whichever of a normal word line and a redundancy word line should be activated. After the judgment is made, the row address latching signal RCLK', which is a delayed row address latching signal, is driven high, and either of the normal word decoder 160 and redundancy word decoder 150 is selected. For example, The redundancy control circuit produces the signal XDES of a low logic level at first. Then, the redundancy control circuit changes the level of the signal XDES from the low logic level to a high logic level when the redundancy control circuit receives the rising edge of the signal RCLK' and the signal AC indicating that an addressed memory cell is not a defective cell. On the other hand, the normal word line decoder does not select any normal word lines at all when the normal word line decoder receives the signal XDES of the low logic level. The normal word line decoder selects one of the normal word lines in response to the address PXA0~PXAk after the level of the signal XDES changes from the low logic level to the high logic level. The time required for activating a normal word line is therefore dependent on the normal word enabling signal XDES indicating the results of the judgment. However, the number of normal word lines is larger than the number of redundancy word lines. The number of stages of logic circuits included in the normal word decoder 160 is much larger than that included in the redundancy word decoder 150. As shown in FIG. 9, it takes much time to activate a normal word line. Quick access to a memory cell has therefore been disabled in the past.

SUMMARY OF THE INVENTION

An object of the present invention is to provide a semiconductor memory having a redundancy circuit, which can activate a normal word line earlier as well as prevent a multiword movement.

another object of the present invention is to provide a semiconductor memory which improves an access speed.

According to the present invention, there is provided a semiconductor memory including normal memory cells, redundancy memory cells, normal word lines, redundancy word lines, a normal word line selecting/driving means, an address judging means, and a control means. The redundancy memory cells are intended to redress a defect occurring in a normal memory cell. The normal memory cells are selected over the normal word lines. The redundancy memory cells are selected over the redundancy word lines. The normal word line selecting/driving means selects and drives a normal word line in response to externally fed address signals. The address judging means judges whether the address signals represent the address of a defective normal memory cell. Based on the results of judgment output from the address judging means, the control means activates one of a normal word line and a redundancy word line and inactivates the other word line. In an initial state, irrespective of the results of judgment output from the address judging means, a normal word line is activated and a redundancy word line is inactivated. When the judging means judges that the address signals represent the defective address, the control means inactivates the normal word line and activates the redundancy word line.

According to the present invention, there is provided a semiconductor memory comprising normal memory cells, redundancy memory cells, a normal word decoder, and a redundancy word decoder. The redundancy memory cells are intended to redress a defect occurring in a normal memory cell. The normal word decoder selects and drives a normal memory cell. The redundancy word decoder selects and drives a redundancy memory cell. The semiconductor memory further comprises address pre-decoders, an address judgment circuit, and a redundancy control circuit. The address pre-decoders acquire row address signals fed externally synchronously with a first clock signal, decode the signals, and transfer the resultant pre-decoded signals to the normal word decoder. The address judgment circuit judges whether the row address signals represent the address of a defective normal memory cell. The redundancy control circuit acquires the results of judgment output from the address judgment circuit synchronously with a second clock signal, and transfers the results of judgment to the redundancy word decoder. If the results of judgment demonstrate that the address signals represent the defective address, the redundancy control circuit outputs a control signal used to inactivate the normal word decoder. If the results of judgment demonstrate that the address signals do not represent the defective address, the redundancy control circuit outputs a control signal used to activate the normal word decoder.

In this case, the first clock signal makes a transition prior to output of the results of judgment from the address judgment circuit. The second clock signal makes a transition prior to transfer of the pre-decoded signals to the normal word decoder.

The second clock signal is produced by delaying the first clock signal by a predetermined time interval.

Moreover, according to the present invention, there is provided a semiconductor memory including normal memory cells, redundancy memory cells, a normal word decoder, a redundancy word decoder, an address judgment circuit, a redundancy control circuit, and a selecting means. The redundancy memory cells are intended to redress a defect occurring in a normal memory cell. The normal word decoder drives a normal word line over which a normal memory cell is selected. The redundancy word decoder drives a redundancy word line over which a redundancy memory cell is selected. The address judgment circuit judges whether input address signals represent the address of a defective normal memory cell. The redundancy control circuit activates one of a normal memory cell and a redundancy memory cell and inactivates the other memory cell according to the results of judgment output from the address judgment circuit. The redundancy control circuit outputs a first control signal used to control the normal memory cell and a second control signal used to control the redundancy memory cell. The selecting means selects based on the first control signal whether a sense amplifier for amplifying data retrieved from the normal memory cell should be activated.

DESCRIPTION OF THE PREFERRED EMBODIMENTS

The preferred embodiments of the present invention will be described in detail hereinafter with reference to the accompanying drawings.

Figure 1:
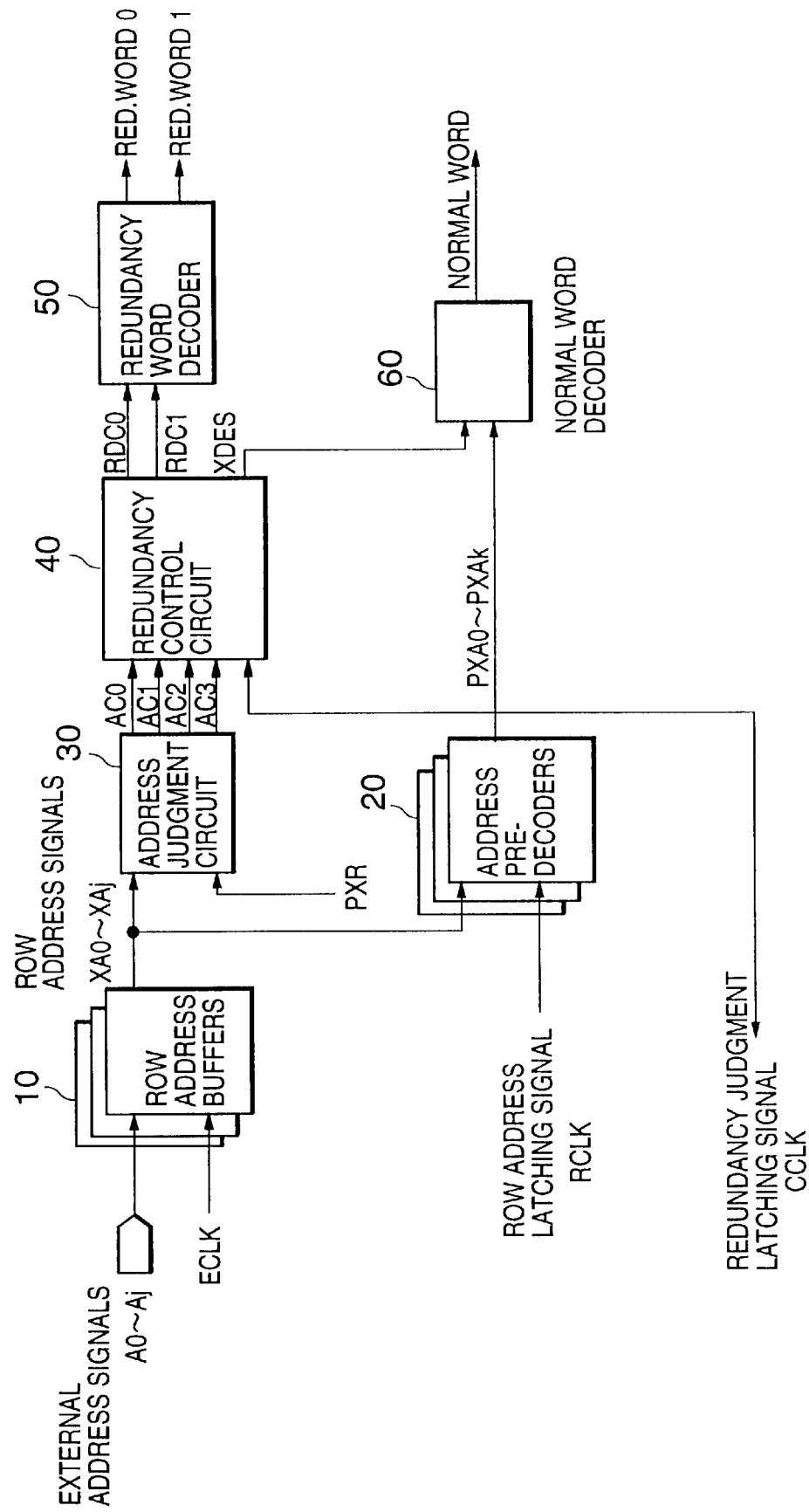
FIG. 1 shows circuitry in accordance with a first embodiment of the present invention.

FIG. 1 shows circuitry in accordance with the first embodiment of the present invention. A semiconductor memory in accordance with the present invention including row address buffers 10, address pre-decoders 20, an address judgment circuit 30, a redundancy control circuit 40, a redundancy word decoder 50, and a normal word decoder 60.

The number of row address buffers 10 is the same as the number of external address signals fed externally. The row address buffers 10 acquire external address signals A0 to Aj at the leading edge of an external address latching signal ECLK. Row address signals XA0 to XAj output from the row address buffers are transferred to the address judgment circuit 30 and address pre-decoders 20.

The address pre-decoders 20 pre-decode the plurality of row address signals XA0 to XAj respectively, and acquire the resultant pre-decoded signals at the leading edge of a row address latching signal RCLK. Address pre-decoded signals PXA0 to PXAk output from the address pre-decoders 20 are transferred to the normal word decoder 60.

Figure 2:
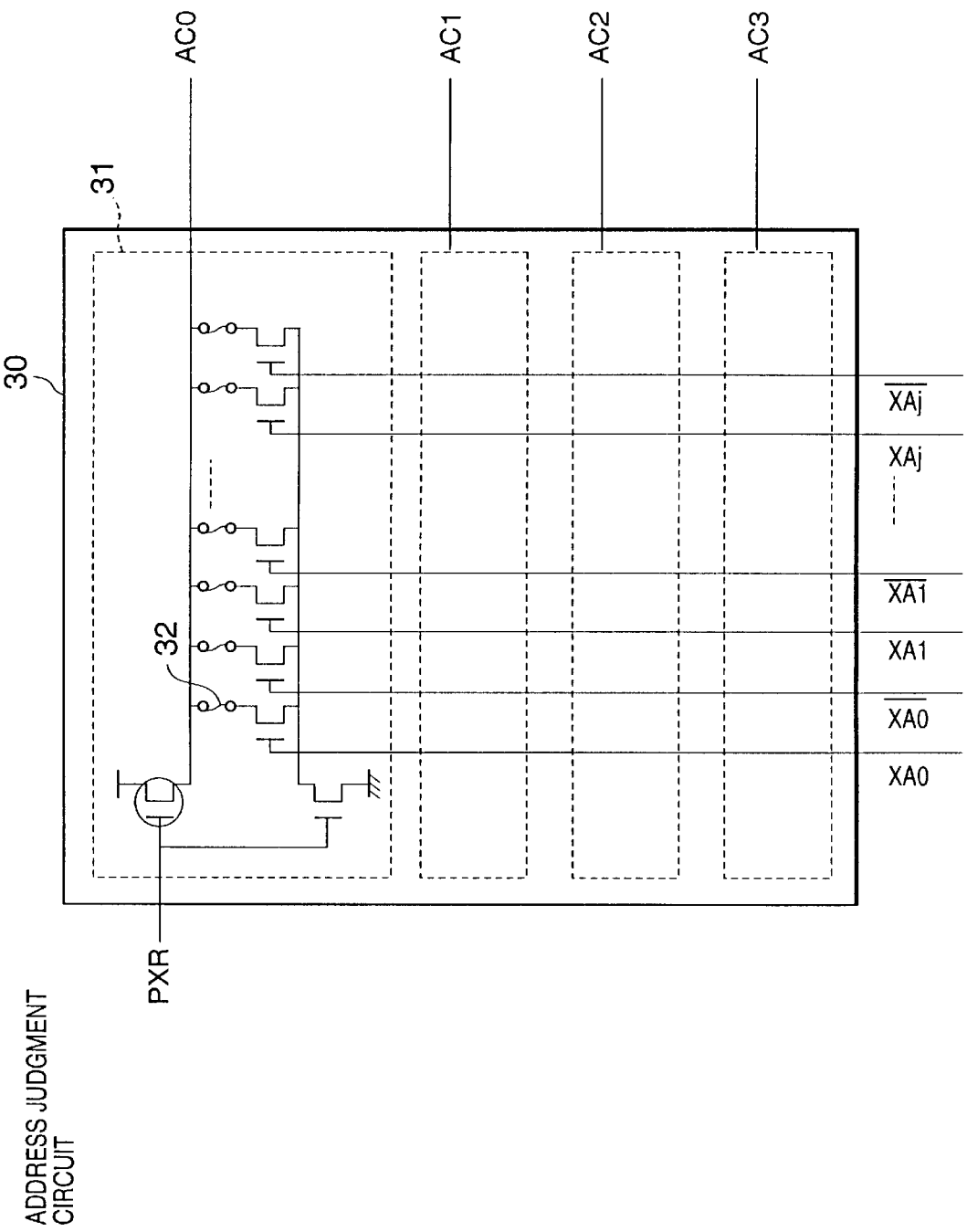
FIG. 2 shows an address judgment circuit employed in the first embodiment of the present invention.

The address judgment circuit 30 has any number of stages. For example, as shown in FIG. 2, the addresses of defective normal memory cells can be pre-set in the address judgment circuit 30 using fuses or the like. An address represented by the row address signals XA0 to XAj is compared with the pre-set addresses synchronously with a redundancy address latching signal PXR. The results of the comparison are transferred as redundancy judgment signals AC0 to AC3 to the redundancy control circuit 40. For example, if the results of redundancy judgment demonstrate that the address agrees with any of the pre-set addresses, a redundancy judgment signal is driven high and transferred to the redundancy control circuit. If the address disagrees with the pre-set addresses, the redundancy judgment signal is driven low.

Figure 3:
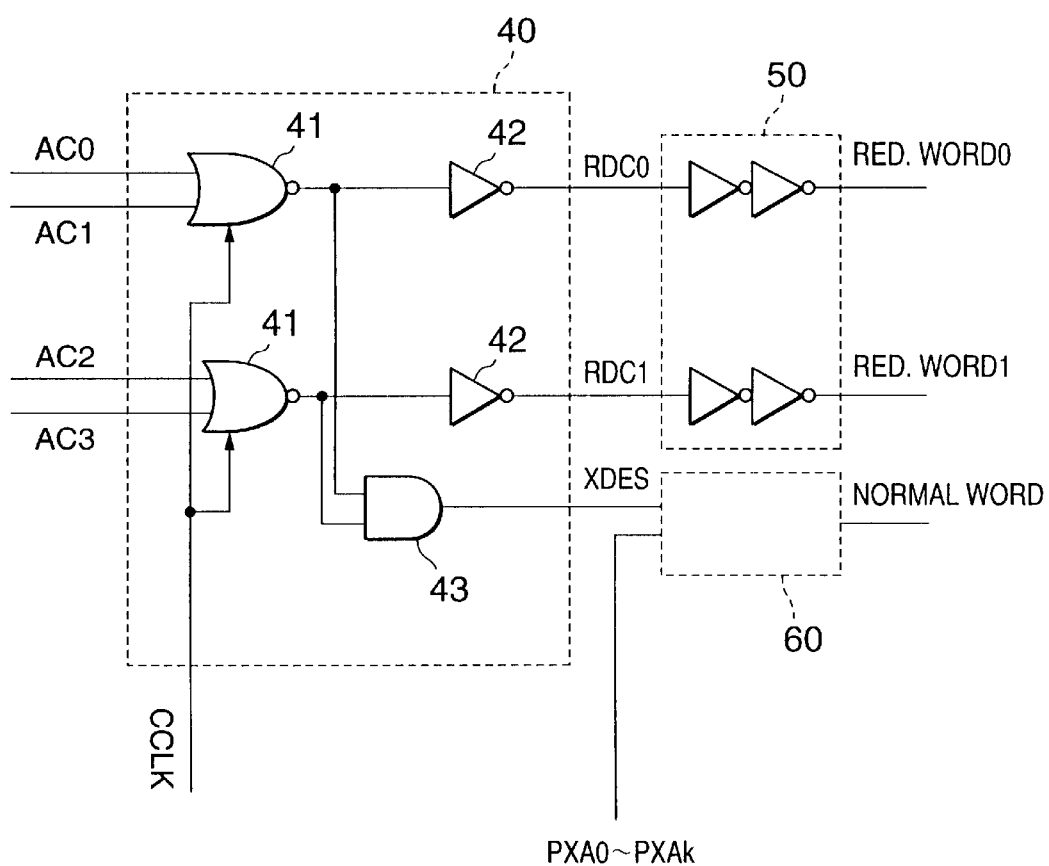
FIG. 3 shows a redundancy control circuit employed in the first embodiment of the present invention.

The redundancy control circuit 40 acquires the redundancy judgment signals AC0 to AC3 at the leading edge of a redundancy judgment latching signal CCLK. The redundancy control circuit 40 judges whether a redundancy word line should be activated. Redundancy word enabling signals RDC0 and RDC1 are output in relation to the redundancy judgment signals AC0 to AC3, and transferred to the redundancy word decoder 50. A normal word disabling signal XDES that is another output of the redundancy control circuit is transferred to the normal word decoder 60. FIG. 3 shows the circuitry of the redundancy control circuit 40, wherein signals Red.Word0 and Red.Word1 represent sub-words that are not shown. The redundancy judgment signals AC0 to AC3 are acquired by a NOR circuit 41 at the leading edge of the redundancy judgment latching signal. The redundancy word enabling signals RDC0 and RDC1 are output. Other word lines are selected and driven according to the other ones of the redundancy judgment signal AC0 to AC3.

The normal word decoder 60 is controlled with the address pre-decoded signals PXA0 to PXAk and the normal word disabling signal XDES. The normal word decoder 60 drives a normal word line associated with an input external address. The normal word decoder 60 is realized with, for example, an AND circuit having multiple input terminals. When the normal word disabling signal XDES is high, if the address pre-decoded signals PXA0 to PXAk represent a predetermined combination of 1s and 0s, the normal word decoder 60 activates a predetermined normal word line. FIG. 1 shows only one normal word line for brevity's sake. In detail, the normal word decoder 60 is inputted with a plurality of the address pre-decoded signals PXA0 to PXAk and selects one of many normal word lines. The normal word decoder 60 therefore includes a plurality of logic gate stages to decode the inputted address pre-decoded signal (not shown). For example, the signal XDES is inputted at the final stage of the logic gate stages. The final stage is permitted to issue based on receipt of the signal XDES of the high logic level. The final stage does not select one of the word lines until the final stage receives the signal XDES of the high logic level. On the other hand, each of the logic gate stages except for the final stages thereof performs its decoding irrespective of the signal XDES. Therefore, the normal word decoder 60 can select one of the normal word lines as soon as the signal XDES of the high logic level is received.

The redundancy word decoder 50 is controlled with control signals RDC0 and RDC1 output from the redundancy control circuit 40. The redundancy word decoder 50 selects and drives redundancy word lines indicated with the addresses set in the address judgment circuit 30 using the redundancy word signals Red.Word0 and Red.Word1. For using a redundancy memory cell, the normal word disabling signal XDES is driven low and the normal word decoder 60 is inactivated.

Actions to be performed in accordance with the present embodiment will be described in conjunction with FIG. 1 showing the circuitry and the timing chart of FIG. 4.

The row address buffers 10 acquire the external address signals A0 to Aj at the leading edge of the external address latching signal ECLK, and outputs them as the row address signals XA0 to XAj to the address judgment circuit 30 and address pre-decoders 20.

The address pre-decoders 20 pre-decode the signals XA0 to XAj, acquire the resultant signals at the leading edge of the row address latching signal RCLK, and output the address pre-decoded signals PXA0 to PXAk. Noted is that the address latching signal RCLK is validated prior to the redundancy judgment latching signal CCLK to be described later.

The address judgment circuit 30 compares the address represented by the row address signals XA0 to XAj with the addresses of defective normal memory cells, which are pre-set using, for example, fuses, synchronously with the redundancy latching signal PXR. If the represented address agrees with any of the pre-set addresses, a redundancy judgment signal AC remains high (dashed line in AC in FIG. 4) If the represented address disagrees with the pre-set addresses, the redundancy judgment signal AC is driven low (solid line in AC in FIG. 4).

The redundancy control circuit 40 outputs the redundancy word enabling signal RDC that is initially low and the normal word disabling signal XDES that is initially high. The redundancy control circuit 40 reads the redundancy judgment signal AC at the leading edge of the redundancy judgment latching signal CCLK, and judges whether a redundancy memory cell should be used. For example, for using a redundancy memory cell, the redundancy word enabling signal RDC is driven high (dashed line in RDC in FIG. 4) and the normal word disabling signal XDES is driven low (dashed line in XDES in FIG. 4). At this time, the address latching signal RCLK has already been validated. The address pre-decoders 20 have therefore already applied the address pre-decoded signals PXA0 to PXAk to the normal word decoder 60.

Figure 4:
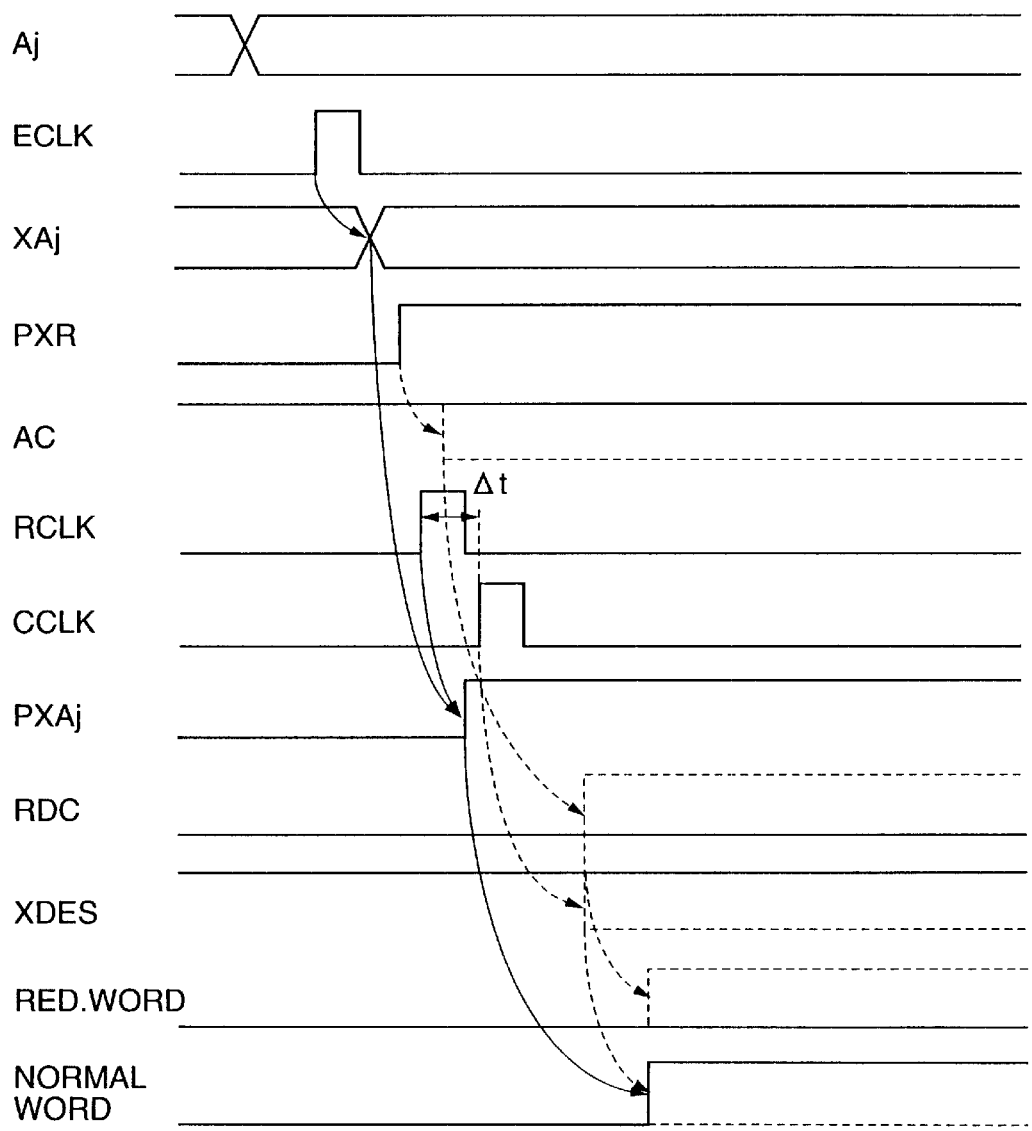
FIG. 4 is a timing chart showing waveforms to indicate actions to be performed in accordance with the first embodiment of the present invention.

Since the normal word disabling signal XDES is initially high (solid line in XDES in FIG. 4), the normal word decoder 60 selects and drives a normal word line according to the address pre-decoded signals PXA0 to PXAk without waiting for the normal word disabling signal XDES (solid line in Normal Word in FIG. 4). When a redundancy word cell is used, the normal word disabling signal XDES is driven low (dashed line in XDES in FIG. 4). Irrespective of the address pre-decoded signals PXA0 to PXAk, no normal word line is selected arid driven, and a normal word signal remains low (dashed line in Normal Word in FIG. 4).

When the redundancy word enabling signal RDC output from the redundancy judgment circuit 40 is high (dashed line in RDC in FIG. 4), the redundancy word decoder 50 selects and drives a redundancy word line (dashed line in Red.Word in FIG. 4). When the redundancy word enabling signal RDC is low (solid line in RDC in FIG. 4), no redundancy word line is driven and a redundancy word signal remains low (solid line in Red.Word in FIG. 4).

As mentioned above, the number of normal word lines is larger than the number of redundancy word lines. The number of stages of logic circuits included in the normal word decoder 60 is much larger than that included in the redundancy word decoder 50. There is a time difference $\Delta t0$ between the time from the instant the redundancy word enabling signal RDC is validated to the instant a redundancy word line is activated, and the time from the instant the normal word disabling signal XDES is validated and the address pre-decoded signals PXA0 to PXAk represent a predetermined combination of 1s and 0s to the instant a normal word line is activated. When the time difference is substantially agreed with a time lag $\Delta t$ by which the redundancy judgment latching signal CCLK lags behind the row address latching signal RCLK, a delay in selection caused by the normal word decoder 60 is nullified.

According to the present embodiment, the address pre-decoders 20 and redundancy control circuit 40 are controlled mutually independently. The row address latching signal RCLK is driven high earlier irrespective of whether the redundancy judgment signal AC is driven high or low. Only when a redundancy memory cell is used, it is suspended to bring the normal word signal to a high level. A normal word line can be activated more quickly than it conventionally is. Namely, a normal word line to be activated using many logic circuits included in the normal word decoder is controlled earlier. Eventually, the action of the semiconductor memory can be speeded up.

According to the present embodiment, the semiconductor memory may be of a split decoding type. In this case, after a normal word line is selected according to the address pre-decoded signals PXA0 to PXAk, selection signals corresponding to the low-order bits of the address signals (for example, XA0 and XA1) are selected and driven. A sub-word line connected to a memory cell is driven according to the normal word signal and selection signals. When this split decoding method is adopted, a certain time $\Delta t1$ is required for actually driving a sub-word line after activating a normal word line or redundancy word line. When the time lag $\Delta t$ by which the redundancy judgment latching signal CCLK lags behind the row address latching signal RCLK is substantially agreed with the sum of $\Delta t0$ and $\Delta t1$, an access speed is further increased.

Figure 5:
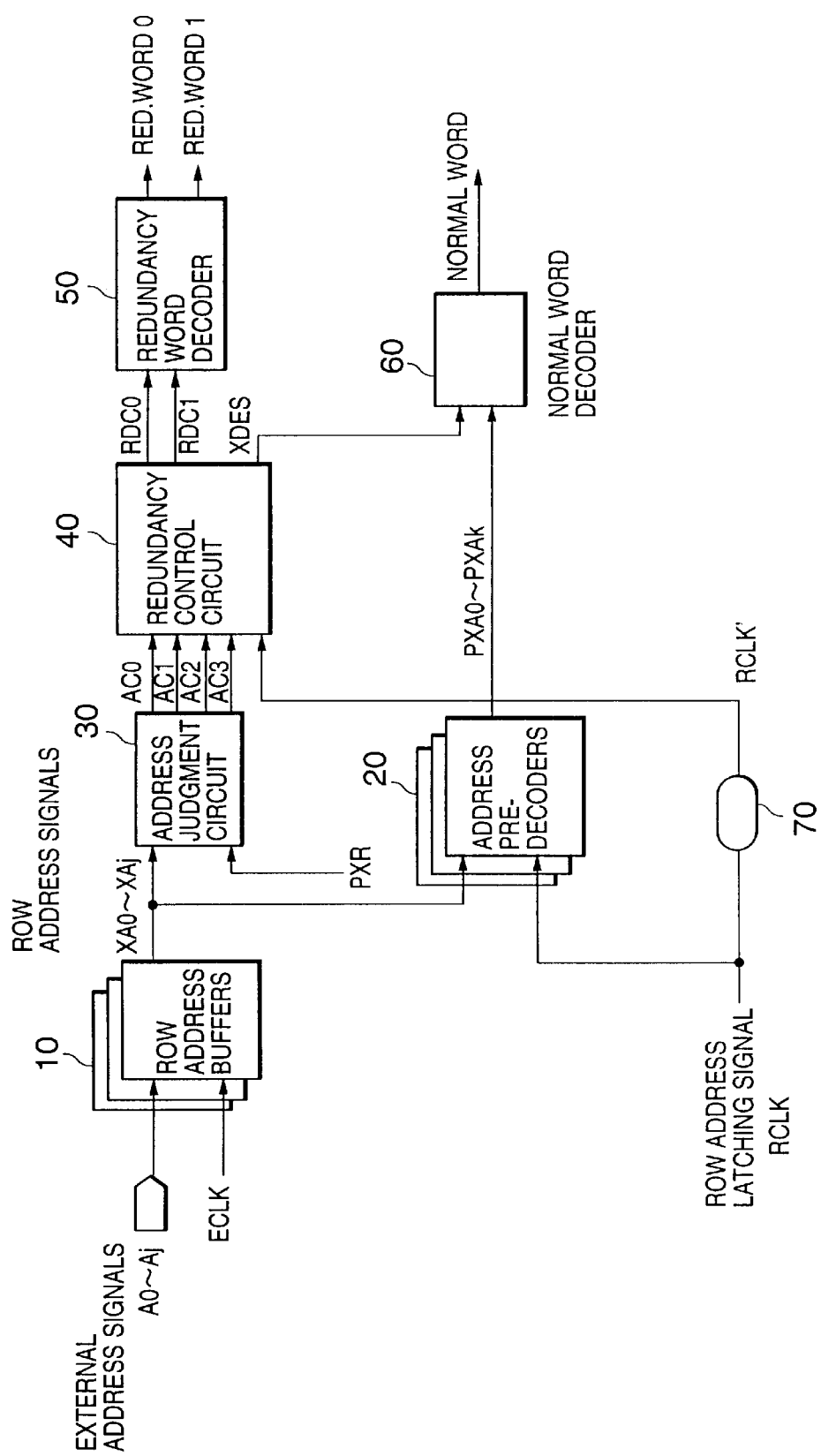
FIG. 5 shows circuitry in accordance with the second embodiment of the present invention.

FIG. 5 shows circuitry in accordance with the second embodiment of the present invention which is characterized by a normal word control signal and a redundancy word control signal. In FIG. 5, the same reference numerals are assigned to components identical to those of the first embodiment. The description of the components will be omitted.

According to the second embodiment of the present invention, a delay circuit 70 is used to produce a signal RCLK' that lags by Δt behind the row address latching signal RCLK. The signal RCLK' is substituted for the redundancy judgment latching signal CCLK. Consequently, the same advantages as those provided by the first embodiment can be provided without any increase in the number of circuits.

Figure 6:
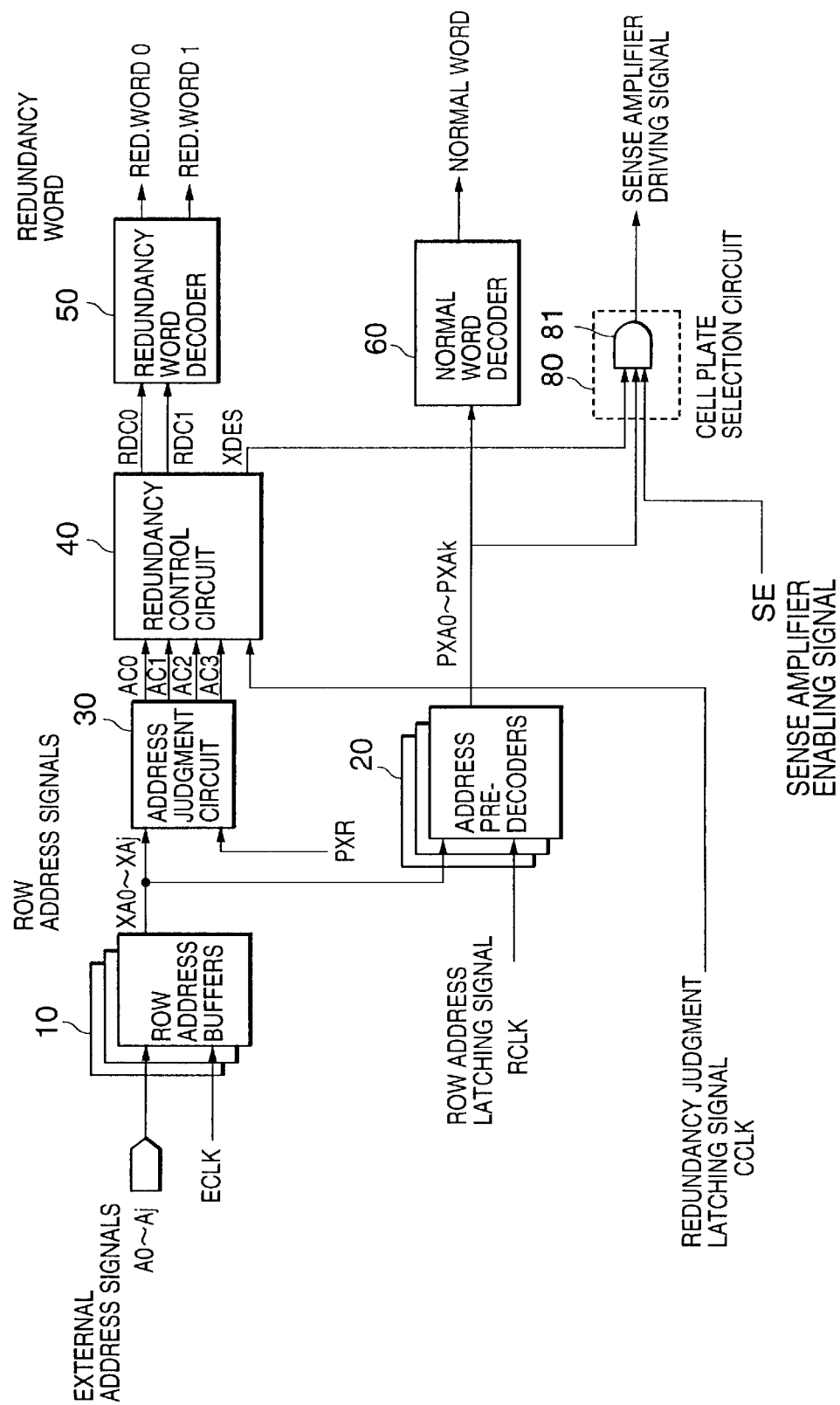
FIG. 6 shows circuitry in accordance with the third embodiment of the present invention.
Figure 7:
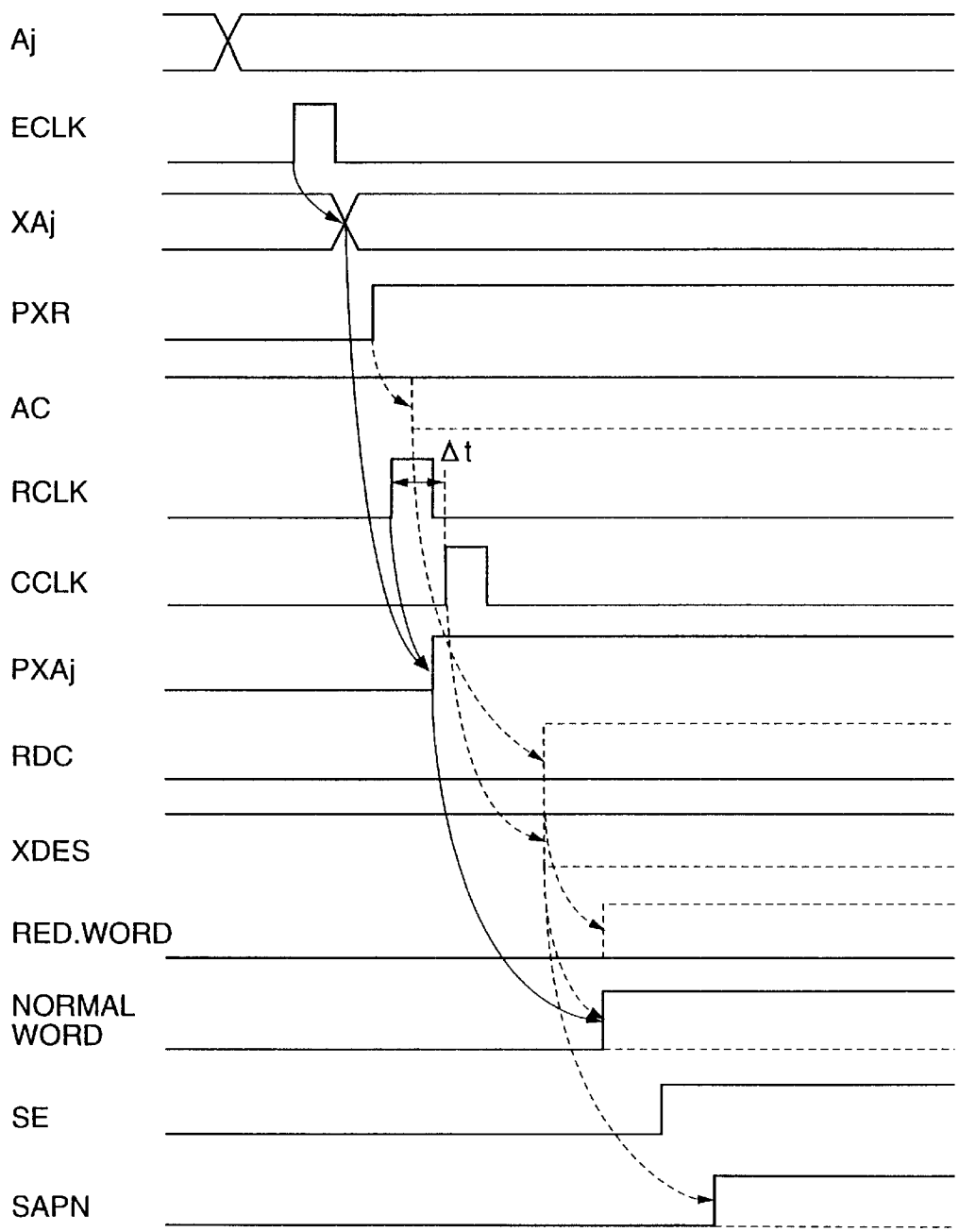
FIG. 7 is a timing chart showing waveforms to indicate actions to be performed in accordance with the third embodiment of the present invention.
Figure 8:
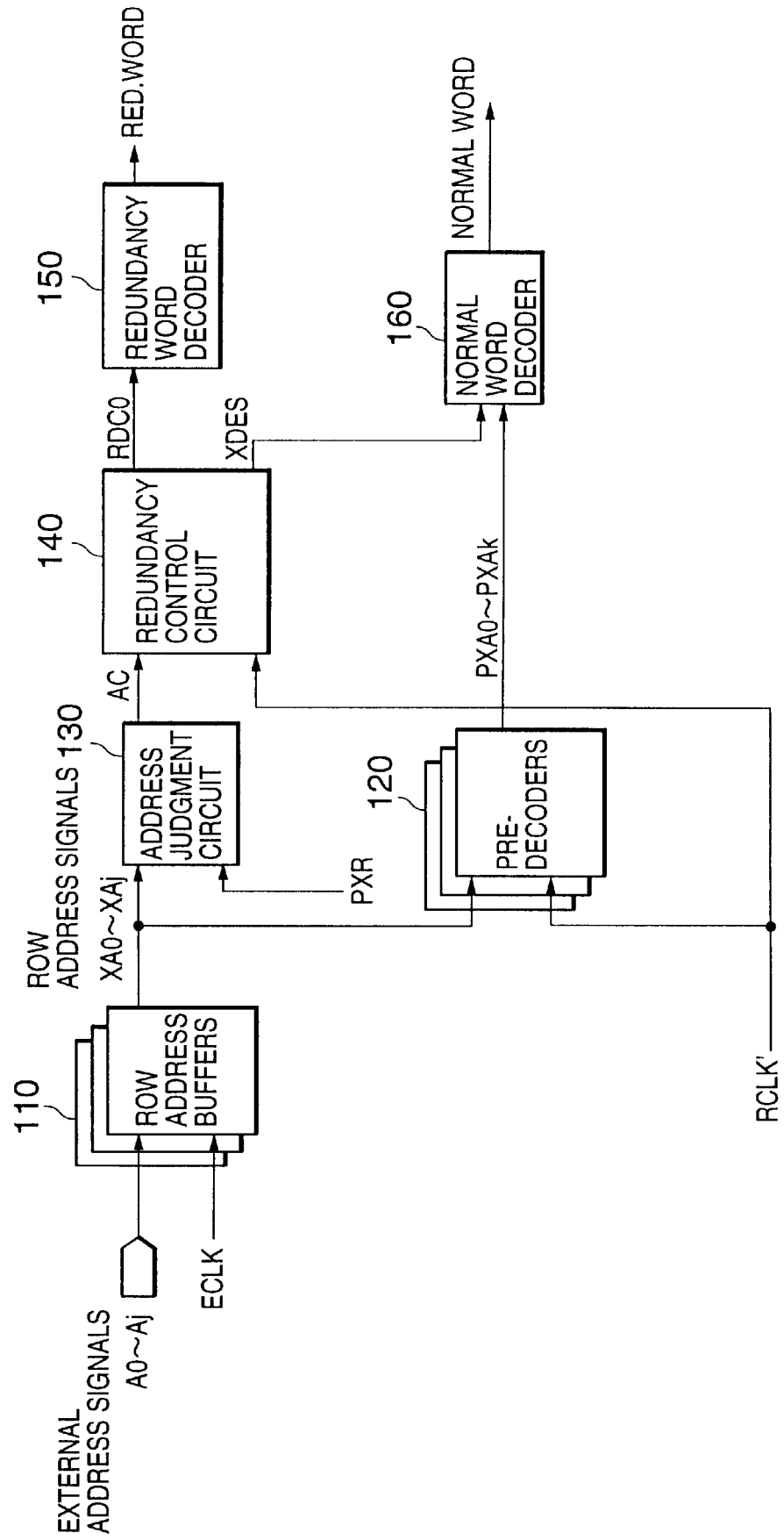
FIG. 8 shows circuitry in accordance with a related art of the present invention.
Figure 9:
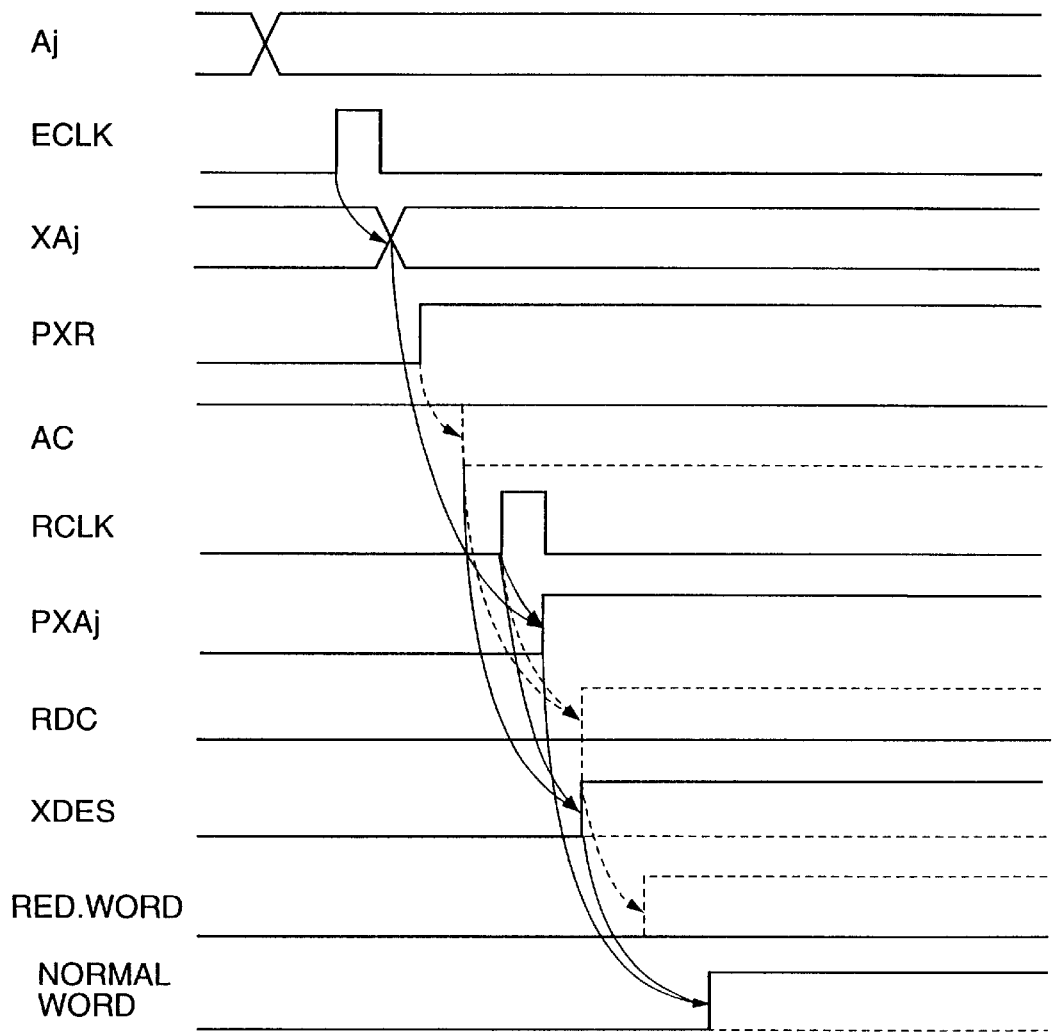
FIG. 9 is a timing chart showing waveforms to indicate actions to be performed in accordance with the related art.

FIG. 6 shows circuitry in accordance with the third embodiment of the present invention, and FIG. 7 is a timing chart showing waveforms. According to the present embodiment, a semiconductor memory includes row address buffers 10, address pre-decoders 20, an address judgment circuit 30, a redundancy control circuit 40, a redundancy word decoder 50, a normal word decoder 60, and a cell plate selection circuit 80.

The cell plate selection circuit 80 drives an array of sense amplifiers associated with the externally fed external addresses A0 to Aj. The cell plate selection circuit 80 is realized with, for example, an AND circuit 81 that inputs the address pre-decoded signals PXA0 to PXAk, a sense amplifier enabling signal SE, and a sense amplifier disabling signal XDES. The cell plate selection circuit 80 transfers a sense amplifier driving signal SAPN to a sense amplifier for selecting and driving a normal memory cell. The sense amplifier driving signal SAPN that goes high after the normal word signal does is invalidated in order to prevent activation of a defective memory cell. The normal memory cells and redundancy memory cells are formed on different plates. A normal word line can therefore be driven earlier irrespective to whether the judgment signal concerning use of a redundancy memory cell is driven high or low. In other words, when a redundancy memory cell is unused, data is read over an already activated normal word line. According to the first embodiment of the present invention, the normal word decoder 60 inactivates a normal word cell so that a redundancy word line will be used. The signal that goes high after the normal word signal goes high is invalidated, whereby activation of a normal word line is controlled earlier.

According to the present embodiment, the phase of the disabling signal XDES is shifted backward. Consequently, a margin for any other signal can be adjusted easily. Even if validation of the normal word disabling signal XDES is retarded, it is unnecessary to retard activation of a normal word line. The action of the semiconductor memory is therefore expected to be further speeded up.

As described so far, according to the present invention, the time required for bringing a word signal, which is applied to a designated address, to a high level can be shortened.

This is because a normal word line is controlled earlier irrespective of whether a redundancy word line is used. A certain specific signal need not be awaited until it is judged whichever of a normal word line and a redundancy word line is used. Consequently, the time required for bringing a word signal, which is applied to a designated address, to a high level can be shortened by, for example, about 2 ns compared with a conventional semiconductor memory.

While this invention has been described in connection with certain preferred embodiment, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A semiconductor memory device, comprising:
   a plurality of normal memory cells;
   a plurality of redundancy memory cells;
   a plurality of normal word lines connected to said normal memory cells;
   a plurality of redundancy word lines connected to said redundancy memory cells and including at least a first redundancy word line;
   a normal word decoder for selecting and driving one of said normal word lines corresponding to an external address signal provided in response to a first clock signal;
   a redundancy word decoder for driving said first redundancy word lines;
   address judging means for judging whether said external address signal corresponds to the address of a defective normal memory cell; and
   a redundancy control circuit having inputs connected to said address judging means and having outputs connected to said normal word decoder and said redundancy word decoder,
   wherein said redundancy control circuit activates said redundancy word decoder and inactivates said normal word decoder in response to a second clock signal which is different from said first clock signal, if said external address signal corresponds to the address of a defective normal memory cell.

2. The semiconductor memory device according to claim 1, wherein said first clock signal is activated earlier than the activation of said second clock signal.

3. The semiconductor memory device according to claim 1, wherein said second clock signal is produced by delaying said first clock signal by a predetermined time.

4. The semiconductor memory device according to claim 1, wherein said redundancy control circuit keeps said normal word decoder active until said redundancy word decoder is activated according to the result of said address judging means.

5. The semiconductor memory device of claim 1, further comprising a plurality of address pre-decoders for receiving a row address signal and said first clock signal,
   wherein said address pre-decoders and said redundancy control circuit are controlled mutually independently.

6. The semiconductor memory device of claim 5, wherein said first clock signal is driven high earlier regardless of a level to which a redundancy judgment signal from said address judging means is driven.

7. The semiconductor memory device of claim 1, wherein a normal word line is controlled prior to a redundancy word line and regardless of whether said redundancy word line is used, and
   wherein a judgement of whether said normal word line or said redundancy word line is used is dependent on other than a predetermined signal.

8. A semiconductor memory device, comprising:
   a plurality of normal word lines connected to normal memory cells;
   a plurality of redundancy word lines connected to redundancy memory cells;
   a row address buffer supplied with external address signals;
   an address judging circuit connected to said row address buffer;

a plurality of address pre-decoders connected to said row address buffer, and provided with a row address signal in response to a first clock signal;

a redundancy control circuit connected to said address judging circuit, and provided with output signals of said address judging circuit in response to a second clock signal;

a redundancy word decoder connected to said redundancy control circuit, and driving one of said redundancy word lines in response to a redundancy word line enabling signal generated from said redundancy control circuit; and a normal word decoder connected to said address pre-decoders, and driving one of said normal word lines in response to a normal word line enabling signal generated from said redundancy control circuit, wherein said first clock signal is activated earlier than said second clock signal, when said row address signals corresponds to a defective memory cell in said normal memory cell, said redundancy control circuit sets said redundancy word decoder activating and said normal word decoder inactivating.

9. The semiconductor memory device according to claim 8, wherein said address pre-decoders are activated before said redundancy control circuit sets said redundancy word decoder and said normal word decoder.

10. The semiconductor memory device according to claim 8, wherein said second clock signal is activated for a predetermined time delay from said first clock signal activating, said predetermined time delay is from a time of said address pre-decoders being activated to a time of an address pre-decoded signal being carried to said normal word decoder.

11. The semiconductor memory device according to claim 8, wherein said redundancy control circuit comprises a plurality of NOR circuits which generate said redundancy word line enable signal in response to said second clock signal, an AND circuit which is provided with output signals of said NOR circuits and generates said normal word line enable signal.

12. The semiconductor memory device of claim 8, wherein said address pre-decoders and said redundancy control circuit are controlled mutually independently.

13. The semiconductor memory device of claim 12, wherein said first clock signal is driven high earlier regardless of a level to which said outputs signals of said address judging circuit are driven.

14. The semiconductor memory device of claim 8, wherein normal word line is controlled prior to a redundancy word line and regardless of weather said redundancy word line is used, and wherein a judgement of weather said normal word line or said redundancy word line is used is dependent on other than predetermined signal.

15. A semiconductor memory device, comprising:

a plurality of normal word lines connected to normal memory cells;

a plurality of redundancy word lines connected to redundancy memory cells;

a plurality of row address buffers supplied with each of external address signals;

an address judging circuit connected to said row address buffers;

a plurality of address pre-decoders connected to each of said row address buffers, and provided with each of row address signals in response to a first clock signal;

a redundancy control circuit connected to said address judging circuit, and provided with output signals of said address judging circuit in response to a second clock signal;

a redundancy word decoder connected to said redundancy control circuit, and driving one of said redundancy word lines in response to a redundancy word line enabling signal generated from said redundancy control circuit;

a cell plate selection circuit, connected to said address pre-decoders and said redundancy control circuit, supplied with a sense amplifier enabling signal and generating a sense amplifier driving signal; and a normal word decoder connected to said address pre-decoders, wherein said first clock signal is activated earlier than said second clock signal.

16. A semiconductor memory device, comprising:

an address judging circuit;

a plurality of address pre-decoders provided with each of row address signals in response to a first clock signal;

a redundancy control circuit connected to said address judging circuit, and provided with output signals of said address judging circuit in response to a second clock signal;

a redundancy word decoder connected to said redundancy control circuit, and driving a redundancy word line in response to a redundancy word line enabling signal generated from said redundancy control circuit; and a cell plate selection circuit connected to said address pre-decoders and said redundancy control circuit, supplied with a sense amplifier enabling signal and generating a sense amplifier driving signal.

17. The semiconductor memory device of claim 16, further comprising:

a normal word decoder connected to said address pre-decoders.

18. The semiconductor memory device of claim 16, further comprising:

a plurality of normal word lines connected to normal memory cells;

a plurality of redundancy word lines connected to redundancy memory cells; and a plurality of row address buffers supplied with each of external address signals, said address judging circuit being connected to said row address buffers.

19. The semiconductor memory device of claim 16, wherein said first clock signal is activated earlier than said second clock signal.

20. The semiconductor memory device of claim 16, wherein the redundancy word decoder and the normal word decoder are controlled by the redundancy control circuit in response to said second clock signal.

21. The semiconductor memory device of claim 16, wherein a normal word line is controlled prior to a redundancy word line and regardless of whether said redundancy word line is used, and wherein a judgement of whether said normal word line or said redundancy word line is used is dependent on other than a predetermined signal.

* * * * *